United States Patent
Leobandung et al.

(10) Patent No.: US 6,404,014 B1
(45) Date of Patent: Jun. 11, 2002

(54) PLANAR AND DENSELY PATTERNED SILICON-ON-INSULATOR STRUCTURE

(75) Inventors: Effendi Leobandung, Wappingers Falls; Devendra K. Sadana, Pleasantville; Dominic J. Schepis, Wappingers Falls; Ghavam Shahidi, Elmsford, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/708,337

(22) Filed: Nov. 8, 2000

Related U.S. Application Data

(62) Division of application No. 09/250,895, filed on Feb. 16, 1999, now Pat. No. 6,180,486.

(51) Int. Cl.[7] .................................................. H01L 27/01
(52) U.S. Cl. ........................................ 257/347; 257/67
(58) Field of Search ............................ 257/347, 67, 900

(56) References Cited

U.S. PATENT DOCUMENTS

| | | | |
|---|---|---|---|
| 4,758,531 A | 7/1988 | Beyer et al. ................ 438/429 |
| 5,292,689 A | 3/1994 | Cronin et al. ............... 437/228 |
| 5,399,507 A | 3/1995 | Sun .............................. 437/24 |
| 5,504,033 A | 4/1996 | Bajor et al. ................. 438/405 |
| 5,518,949 A | 5/1996 | Chen ............................ 437/62 |
| 5,539,240 A | 7/1996 | Cronin et al. ............... 257/520 |
| 5,567,634 A | 10/1996 | Hebert et al. ............... 430/270 |
| 5,598,019 A | 1/1997 | Komori et al. .............. 257/397 |
| 5,665,619 A | 9/1997 | Kwan et al. ................. 438/270 |
| 5,811,315 A | 9/1998 | Yindeepol et al. .......... 438/405 |
| 5,894,152 A * | 4/1999 | Jaso et al. ................... 257/347 |
| 6,180,486 B1 * | 1/2001 | Leobandung et al. ....... 438/405 |
| 6,232,649 B1 * | 5/2001 | Lee ............................. 257/588 |

OTHER PUBLICATIONS

"Defect–Free Silicon on Insulator by Oxidized Porous Silicon" by L.A. Nesbit. IBM Technical Disclosure Bulletin. vol. 27, No. 8, Jan. 1985.p. 4632.

"Wet Processing: Cleaining, Etching, and Liftoff"by S. Wolf Ph.D., R. N. Tauber Ph.D., Silicon Processing for the VLSI Era. vol. 1, 1986, pp.516–517.

* cited by examiner

*Primary Examiner*—Mark V. Prenty
(74) *Attorney, Agent, or Firm*—Ratner & Prestia; Joseph P. Abate, Esq.

(57) ABSTRACT

A planar silicon-on-insulator (SOI) structure and a process for fabricating the structure. The SOI structure has a silicon wafer, an oxide layer, and a silicon layer. Trenches are formed, extending from the top surface of the structure to the silicon wafer, and are filled with a semiconductor. The trenches have a top, a bottom, and side walls. The side walls have side-wall silicon portions. The side-wall silicon portions of the trench side walls are covered by trench side-wall oxide layers. A protective side wall extends over the trench side walls and trench side-wall oxide layers from the trench top to the trench bottom.

7 Claims, 3 Drawing Sheets

PLANAR AND DENSELY PATTERNED SILICON-ON-INSULATOR STRUCTURE

This application is a divisional of U.S. patent application Ser. No. 09/250,895, filed on Feb. 16, 1999, now U.S. Pat. No. 6,180,486.

TECHNICAL FIELD

The present invention relates generally to a silicon-on-insulator (SOI) structure and, more specifically, to a planar, densely patterned SOI structure and to a process for fabrication of such a structure.

BACKGROUND OF THE INVENTION

Patterned SOI (silicon-on-insulator) structures consist of SOI and non-SOI (or bulk) areas. Patterned SOI structures are useful for circuits that require both conventional and SOI devices. Such circuits include, for example, Merged Logic Dynamic Random Access Memory (ML-DRAM) circuits.

One process used to create patterned SOI wafers involves the deposition of epitaxial silicon (selective epi process) into selectively formed trenches. The development of the capability to etch narrow trenches in silicon substrates has increased the importance of the selective epi process. If these narrow trenches can be successfully filled with a silicon material, then it is possible to form closely spaced silicon islands isolated by an insulating layer such as an oxide.

The first step in forming closely spaced silicon islands isolated by an insulating layer is the formation of trenches. In this step, the SOI substrate is selectively etched down to the surface of the base layer in the area where non-SOI substrate is desired, forming a trench. Next, selective epi processing fills the trench.

This method uses epitaxial silicon growth which is selective to exposed silicon, primarily the exposed silicon wafer at the bottom of the etched trench. Selective epitaxial deposition is achieved when silicon atoms possessing high surface mobility migrate to single silicon crystal sites where nucleation is favored. As a result of this selective epi processing, the trench is filled with silicon. The resulting structure comprises an SOI area and a non-SOI area having a trench filled with silicon.

Unfortunately, several problems can arise in performing the selective epi process. One problem is the formation of a damaged silicon crystal structure. This problem is the result of having two or more sources of growth. During epitaxial silicon growth in the trench, it is highly preferable to grow silicon from a single source. An objective of selective epi processing is to fill the trench with silicon having the same crystal lattice structure as the underlying silicon wafer so that, in effect, the silicon filling the trench is an extension of the silicon wafer. When there are two or more sources of silicon growth, the resulting epitaxial silicon grown is damaged because the silicon tends to grow at differing rates and orientations. Thus, the desired uniform silicon crystal structure is not achieved.

A second problem is the formation of bumps. When epitaxial silicon is grown on the silicon layer portion of the trench side wall, a bump is formed between the SOI area and the non-SOI area. This bump has several drawbacks. The most serious consequence is the decreased ability to make small, densely patterned SOI and non-SOI areas. Moreover, these bumps are an obstacle in subsequent planarization steps, often forcing costly and time consuming additional processing steps.

The deficiencies of the use of selective epi processing to fill trenches show that a need still exists for eliminating epitaxial growth of silicon originating from the silicon layer portion of the trench side walls. To overcome the shortcomings of selective epi processing, a new process is provided. An object of the present invention is to provide a process of filling a trench using selective epi processing, in which the process forms the desired uniform crystal structure of the underlying silicon layer and also does not create bumps between the SOI and non-SOI areas.

SUMMARY OF THE INVENTION

To achieve these and other objects, and in view of its purposes, the present invention provides a process for fabricating a planar SOI structure having areas devoid of buried oxide. Using the selective epitaxial process, a planar SOI structure is formed having a trench filled with a uniform crystal structure matching the crystal lattice structure of the underlying silicon wafer. In addition, the present invention limits the formation of bumps between the SOI area and non-SOI area of the planar SOI structure.

The SOI structure of the present invention comprises a silicon wafer, an oxide layer, and a silicon layer. The structure has trenches extending from the top surface of the structure to the silicon wafer and being filled with a semiconductor. The trenches have a top, a bottom, and side walls with side-wall silicon portions. The silicon side-wall portions of the trench side walls are covered by trench side-wall oxide layers. A protective side wall extends over the trench side walls and trench side-wall oxide layer from the trench top to the trench bottom.

In forming a planar SOI structure of the present invention, a substrate is first obtained having a silicon wafer, an oxide layer, a silicon layer, and a nitride layer. The substrate has a top surface. The process comprises the following steps:

(a) forming a trench in the substrate extending from the substrate top surface to the silicon wafer, the trench having side walls and a bottom, the trench side walls having side-wall silicon portions;

(b) forming an oxide layer on the trench bottom and an oxide layer on the side-wall silicon portions to form a trench bottom oxide layer and trench side-wall oxide layers;

(c) forming a protective side wall on the trench side wall extending over the trench side-wall oxide layer and overlying a portion of the trench bottom oxide layer;

(d) removing all of the trench bottom oxide layer not underlying the protective side wall; and (e) filling the trench with a semiconductor to at least the top surface.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be illustrated with reference to the figures in which similar numbers indicate the same elements in all figures. Such figures are intended to be illustrative, rather than limiting, and are included to facilitate the explanation of the apparatus of the present invention.

Figure 1:
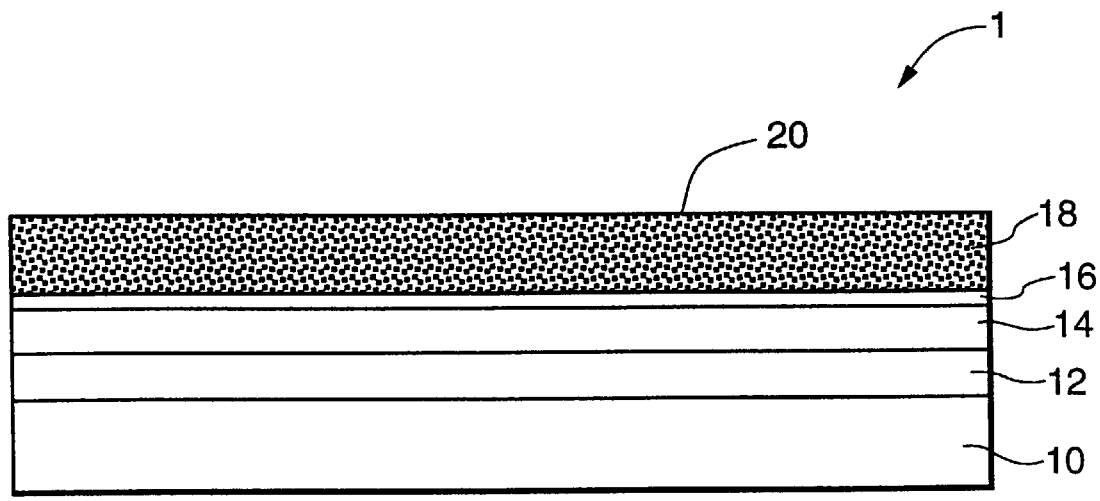
FIG. 1 shows in schematic representation an SOI structure having a silicon wafer, an oxide layer, a silicon layer, a protective oxide layer, and a nitride layer.

Beginning with FIG. 1, the first step in implementing the process of the present invention involves obtaining a substrate 1 comprising a silicon wafer 10 having formed on the silicon wafer 10 an oxide layer 12, a silicon layer 14, and a nitride layer 18. Substrate 1 (and, specifically, nitride layer 18 of substrate 1) has an exposed surface 20. Nitride layer 18 is selected from common nitride layers known in the art, such as silicon nitride, boron nitride, and oxynitride. In a preferred embodiment, silicon nitride is used to form nitride layer 18.

The substrate 1 may also contain a protective oxide layer 16. Disposed on silicon layer 14, protective oxide layer 16 protects silicon layer 14 from damage caused by formation of nitride layer 18. In a preferred embodiment, the thickness of the oxide layer 12 is from about 220 nm to about 400 nm, the thickness of the silicon layer 14 is from about 100 nm to about 300 nm, the thickness of the protective oxide layer 16 is from about 5 nm to about 15 nm, and the thickness of the nitride layer 18 is from about 220 nm to about 500 nm. The techniques used to form the substrate 1 are well known and are not critical to the present invention.

Figure 2:
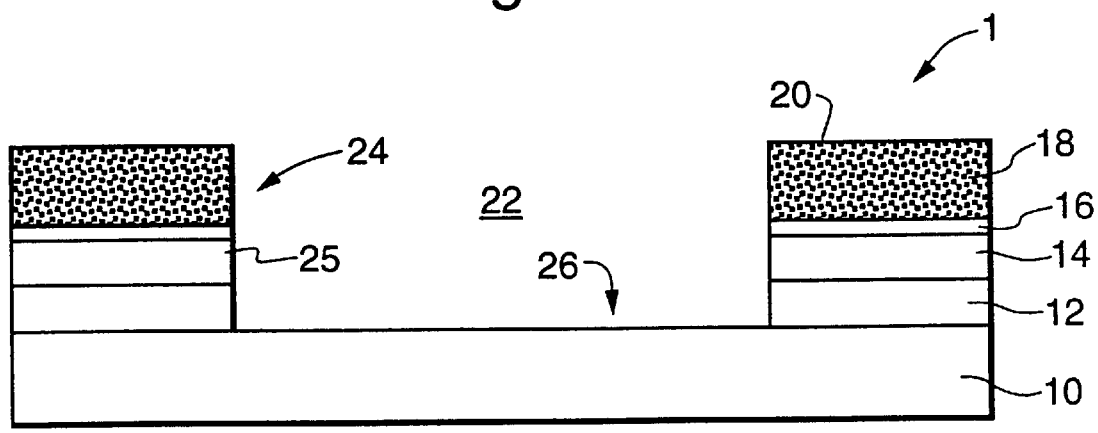
FIG. 2 shows in schematic representation the SOI structure of FIG. 1 in which the nitride layer, protective oxide layer, silicon layer, and oxide layer have been partially removed to form a trench.

The next step in the process of the present invention is to create trenches in the desired non-SOI areas of the structure illustrated in FIG. 1. This step is done through conventional techniques, such as masking and etching. A trench 22 is formed, as illustrated in FIG. 2, such that trench 22 extends from the exposed surface 20 of the substrate 1 to silicon wafer 10.

The trench 22 has side walls 24 and a bottom 26. The trench side walls 24 are preferably formed such that they are substantially perpendicular to the exposed surface 20. The trench side walls 24 are preferably etched using dry etching techniques. Examples of suitable dry etching techniques include reactive ion etching (RIE) and plasma enhanced etching. A side-wall silicon portion 25 of the trench side walls 24 is formed adjacent the exposed silicon layer 14.

Figure 3:
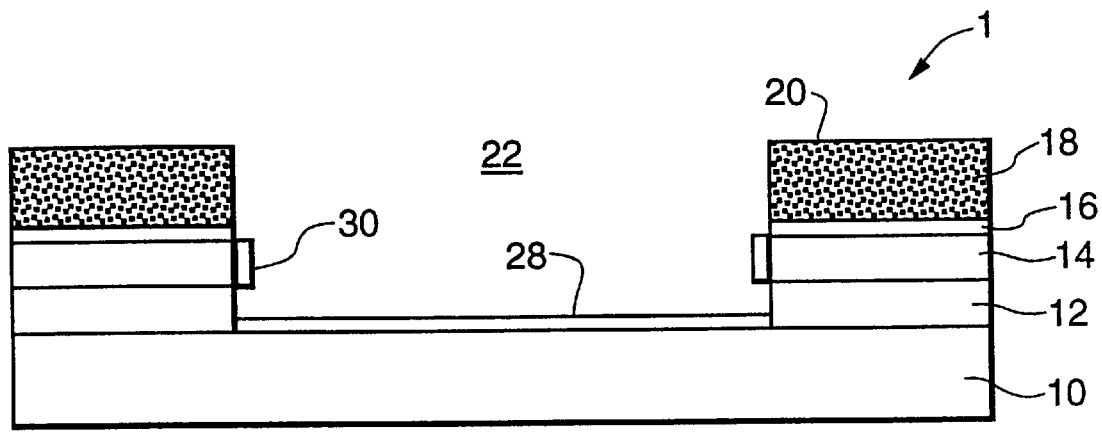
FIG. 3 shows in schematic representation the SOI structure of FIG. 2 in which oxide layers have been formed on the trench bottom and the side-wall silicon portion, forming a trench bottom oxide layer and trench side-wall oxide layers.

Following creation of the trench 22, the next step in the process of the present invention is the formation of an oxide layer on the trench bottom 26 and on the side-wall silicon portion 25. Thus, a trench bottom oxide layer 28 and a trench side-wall oxide layer 30 are formed. This structure is illustrated in FIG. 3. Trench bottom oxide layer 28 and trench side-wall oxide layer 30 protect trench bottom 26 and side-wall silicon portion 25, respectively, from damage during the subsequent step of forming protective side walls, which is described below. In addition, trench bottom oxide layer 28 removes damaged silicon, from the trench bottom 26, which results from the etching step in forming the trench 22.

Figure 4:
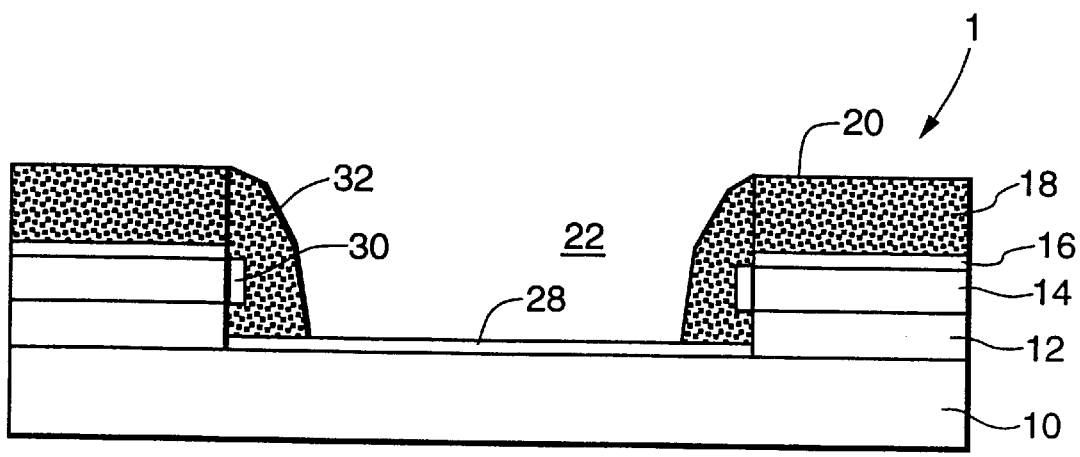
FIG. 4 shows in schematic representation the SOI structure of FIG. 3 in which protective side walls have been formed on the side walls of the trench.

Following formation of the trench bottom oxide layer 28 and trench side-wall oxide layer 30, protective side walls 32 are formed on the trench side walls 24, as illustrated in FIG. 4. The protective side walls 32 completely cover side-wall silicon portion 25. Although trench side-wall oxide layer 30 covers side-wall silicon portion 25, protective side walls 32 serve as barriers during the subsequent step of filling the trench 22 by selective epi processing, which is described below, by preventing epitaxial silicon growth on side-wall silicon portion 25. Without this barrier, bumps tend to form on the exposed surface 20 of substrate 1, between the SOI and non-SOI areas (see FIG. 8), as a result of epitaxial silicon growth on the exposed portion of side-wall silicon portion 25. Eliminating bump formation preserves the ability to make small, densely patterned SOI and non-SOI areas and also simplifies subsequent planarization.

In addition, the protective side walls 32 prevent epitaxial growth stemming from side-wall silicon portion 25. It is highly preferable to have only one source of epitaxial growth. By limiting growth to one source, damage is prevented to the crystal lattice structure of the newly formed silicon.

In forming the protective side walls 32, nitride is first deposited on the trench side walls 24 using conventional deposition techniques, such as low-pressure chemical vapor deposition (LPCVD). Following deposition, the nitride is dry etched, preferably using RIE, to form protective side walls 32. In a preferred embodiment, the nitride is silicon nitride.

It is preferred that both the protective side walls 32 and nitride layer 18 are composed of silicon nitride. During a subsequent step of the process of the present invention, trench bottom oxide layer 28 is removed by wet etching techniques. It has been discovered that silicon nitride is resistant to the chemicals conventionally used in removing trench bottom oxide layer 28. Because both the nitride layer 18 and protective side walls 32 are composed of silicon nitride, removal of the trench bottom oxide layer 28 can be accomplished without damaging nitride layer 18 and protective side walls 32.

Figure 5:
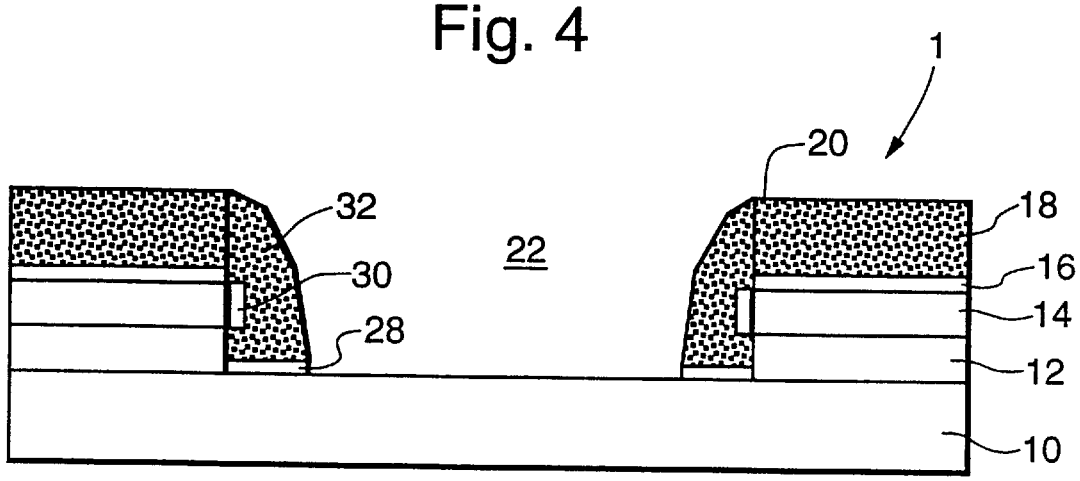
FIG. 5 shows in schematic representation the SOI structure of FIG. 4 in which the portion of the trench bottom oxide layer not underlying the protective side walls has been removed.

As shown in FIG. 5, the next step of the process of the present invention comprises removing the portion of trench bottom oxide layer 28 not underlying the protective side walls 32. This step is done by etching away a portion of the trench bottom oxide layer 28 using conventional wet etching techniques, such as wet etching using hydrofluoric acid. Silicon islands are washed away in this wet etching step. These silicon islands were created on the trench bottom 26 when forming the substrate. In addition, the trench bottom oxide layer 28 protects the trench bottom 26 from damage during the formation of the protective side walls 32.

Figure 6:
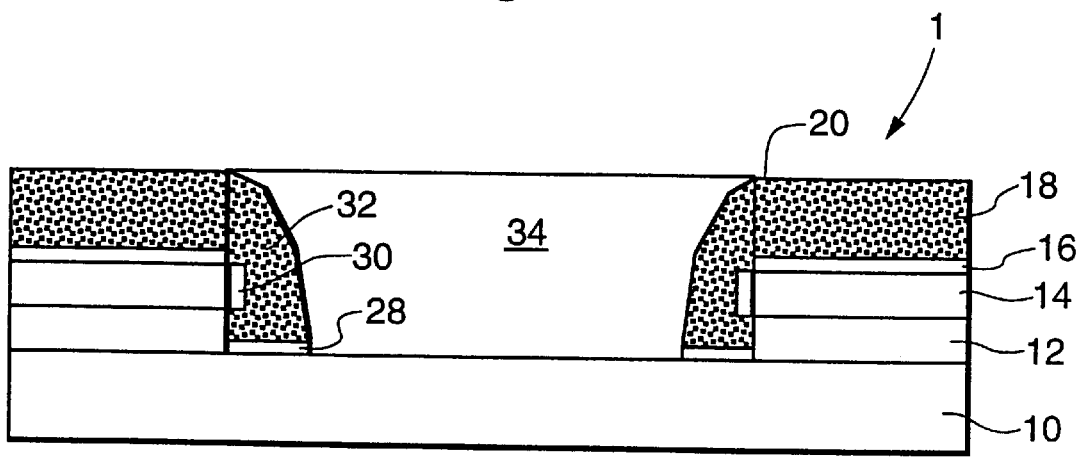
FIG. 6 shows in schematic representation the SOI structure of FIG. 5 in which the trench has been filled with a semiconductor.

After the trench bottom oxide layer 28 has been etched away, the trench 22 is filled using selective epi processing with a semiconductor 34. This step results in the structure of FIG. 6. The crystal lattice structure of the underlying silicon wafer 10 should be duplicated in the epitaxial layer so that, in effect, semiconductor 34 is an extension of silicon wafer 10. The protective side walls 32 prevent growth of semiconductor 34 on side-wall silicon portion 25, thereby eliminating bump formation. The nitride layer 18 and the protective oxide layer 16 also serve as barriers during selective epi processing. In a preferred embodiment, the semiconductor 34 is silicon.

Figure 7:
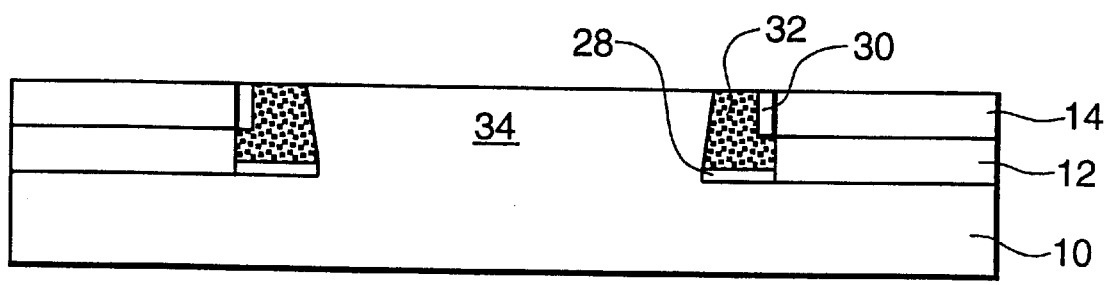
FIG. 7 shows in schematic representation the SOI structure of FIG. 6 in which the nitride layer, the protective oxide layer, portions of the protective side walls, and a portion of the semiconductor have been removed.

As illustrated in FIG. 7, nitride layer 18 and the portion of protective side walls 32 adjacent nitride layer 18 are next removed. These layers are removed using conventional wet etching techniques, such those incorporating phosphoric acid. Next, protective oxide layer 16 (if it exists) is also removed using conventional wet etching techniques, such as those using hydrofluoric acid.

Figure 8:
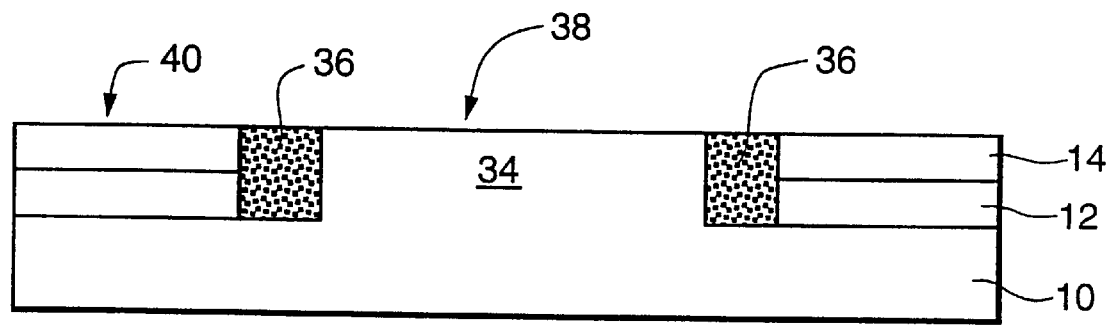
FIG. 8 shows in schematic representation the SOI structure of FIG. 7 in which the trench bottom oxide layer, trench side-wall oxide layer, and protective side walls have been etched to form a trench which has been filled with an oxide.

Following removal of nitride layer 18, a portion of protective side walls 32, and protective oxide layer 16, conventional steps can be applied to complete processing of the SOI substrate. Preferably, the structure of FIG. 7 is planarized by conventional methods, such as chemical mechanical polishing (CMP). In addition to planarization, the trench bottom oxide layer 28, trench side-wall oxide layer 30, and protective side walls 32 of FIG. 7 can be etched to form a smaller trench (relative to trench 22) which is then filled with an oxide. FIG. 8 illustrates the resulting oxide region 36 which isolates the non-SOI area 38 from the active SOI area 40 of the SOI structure.

In one embodiment, a planar SOI structure having sharply delineated areas devoid of buried oxide on a substrate was formed by the following steps. Using the separation by implantation of oxygen process (SIMOX), a high dose of oxygen ions was implanted into a silicon wafer 10 followed by an anneal. This process produced a 300 nm oxide layer 12 beneath a 220 nm silicon layer 14 on the silicon wafer 10. A 10 nm protective oxide layer 16 was next formed on the silicon layer 14 followed by deposition of a 300 nm silicon nitride layer 18 on the protective oxide layer 16. A portion of the nitride layer 18-was removed using photolithography and selective RIE, exposing a portion of the protective oxide layer 16.

Next, using selective RIE, a trench 22 was etched extending from the exposed surface 20 of the nitride layer 18 to the silicon wafer 10. The trench 22 was cleaned using the RCA method, reference of which may be made to in Silicon Processing for the VLSI Era, Volume 1—Process Technology, pp. 516–517 (1986), by S. Wolf and R. N. Tauber. Next, the trench 22 was annealed at 1,000° C. to (1) grow 10 nm trench bottom oxide layer 28 on the trench bottom 26 and trench side-wall oxide layer 30 on the side-wall silicon portion 25 of the trench side walls 24, and (2) repair damage to the silicon wafer 10 resulting from the selective RIE in forming the trench 22.

Protective side walls 32 were formed by depositing 500 nm of silicon nitride oh the trench side walls 24 using LPCVD (low-pressure chemical vapor deposition) followed by selective RIE, which etched the silicon nitride to form the protective side walls 32. Next, the trench bottom oxide layer 28 not underlying the protective side walls 32 was etched using hydrofluoric acid solution, which also removed residual silicon islands formed on the trench bottom 26 as a result of forming the substrate. Using a selective epi process, silicon was grown on the exposed silicon of the trench bottom 26, filling the trench 22.

Next, the nitride layer 18 and a portion of the protective side walls 32 adjacent the nitride layer 18 were removed using phosphoric acid. The protective oxide layer 16 was then removed using hydrofluoric acid. The structure was then annealed to repair damage from the selective epi process and planarized by CMP. Next, the remaining portions of the trench bottom oxide layer 28, trench side-wall oxide layer 30, and protective side walls 32 were removed by etching, forming a trench. This trench was then filled with an oxide.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is Claimed is:

1. A silicon-on-insulator (SOI) structure having a surface and comprising:

a silicon wafer;

an oxide layer on said silicon wafer;

a silicon layer on said oxide layer;

an area devoid of buried oxide defined by a trench being filled with a semiconductor, extending from said surface to said silicon wafer, and having a top, a bottom, and side walls with side-wall silicon portions;

a partial trench bottom oxide layer covering only a portion of the bottom of the trench;

a trench side-wall oxide layer over said side-wall silicon portions of said trench side walls; and a protective side wall extending over said trench side walls from said trench top to said trench bottom, including said trench side-wall oxide layer, and covering and being substantially coextensive along the bottom of said trench with said partial trench bottom oxide layer.

2. The SOI structure of claim 1 wherein said semiconductor is silicon.

3. A silicon-on-insulator (SOI) structure having a surface and comprising:

a silicon wafer;

an oxide layer on said silicon wafer;

a silicon layer on said oxide layer;

an area devoid of buried oxide defined by a trench being filled with a semiconductor, extending from said surface to said silicon wafer, and having a top, a bottom, and side walls with side-wall silicon portions;

a trench side-wall oxide layer over said side-wall silicon portions of said trench side walls; and a silicon nitride protective side wall extending over said trench side walls from said trench top to said trench bottom including said trench side-wall oxide layer.

4. The SOI structure of claim 3 wherein said substrate further comprises a silicon nitride layer formed on said silicon layer.

5. The SOI structure of claim 4 wherein said substrate further comprises a protective oxide layer between said silicon nitride layer and said silicon layer.

6. A silicon-on-insulator (SOI) structure having a surface and comprising:
- a silicon wafer;
- an oxide layer on said silicon wafer;
- a silicon layer on said oxide layer;
- a silicon nitride layer on said silicon layer;
- an area devoid of buried oxide defined by a trench being filled with a silicon semiconductor, extending from said surface to said silicon wafer, and having a top, a bottom, and side walls with side-wall silicon portions;
- a trench side-wall oxide layer over said side-wall silicon portions of said trench side walls; and
- a silicon nitride protective side wall extending over said trench side walls from said trench top to said trench bottom including said trench side-wall oxide layer.

7. The SOI structure of claim 6 further comprising a protective oxide layer between said silicon nitride layer and said silicon layer.

* * * * *